United States Patent [19]

Halamek et al.

[11] Patent Number: 5,766,128
[45] Date of Patent: Jun. 16, 1998

[54] RESPIRATORY MOTION COMPENSATION USING SEGMENTED K-SPACE MAGNETIC RESONANCE IMAGING

[75] Inventors: James A. Halamek, Independence; Mark J. Loncar; Rao P. Gullapalli, both of Richmond Heights, all of Ohio

[73] Assignee: Picker International, Inc., Highland Heights, Ohio

[21] Appl. No.: 704,322

[22] Filed: Aug. 23, 1996

[51] Int. Cl.$^6$ ........................................... A61B 5/055
[52] U.S. Cl. ..................... 600/410; 600/534; 324/307; 324/309
[58] Field of Search ................... 128/653.2, 653.3, 128/716, 721; 324/307, 309; 600/410, 419, 529, 534

[56] References Cited

U.S. PATENT DOCUMENTS

| | | | |
|---|---|---|---|
| 4,565,017 | 1/1986 | Glover | 128/653 |
| 4,706,026 | 11/1987 | Pelc et al. | 324/309 |
| 4,724,386 | 2/1988 | Haacke et al. | 324/309 |
| 4,727,882 | 3/1988 | Schneider et al. | 128/653 |
| 4,779,620 | 10/1988 | Zimmermann et al. | 128/653 |
| 4,991,587 | 2/1991 | Blakeley | 128/653 |
| 5,035,244 | 7/1991 | Stokar | 128/653 |
| 5,329,925 | 7/1994 | NessAiver | 128/653.2 |
| 5,377,680 | 1/1995 | Bernstein et al. | 128/653.2 |
| 5,477,144 | 12/1995 | Rogers | 324/309 |
| 5,499,629 | 3/1996 | Kerr et al. | 128/653.2 |
| 5,522,390 | 6/1996 | Tuithof et al. | 128/653.2 |
| 5,581,184 | 12/1996 | Heid | 324/309 |
| 5,615,676 | 4/1997 | Kohno | 128/653.2 |

OTHER PUBLICATIONS

"Respiratory Ordered Phase Encoding (ROPE): A Method for Reducing Respiratory Motion Artefacts in MR Imaging", Bailes, et al., J. Comput. Assist. Tomography, 9(4):835–838, Jul./Aug. 1985.

"Interleaved Echo Planar Imaging on a Standard MRI System", Butts, et al. MRM 31:67–72 (1994).

"Reducing Motion Artifacts in Two–Dimensional Fourier Transform Imaging", Haacke, et al., MRI 4(4):359–376 (1986).

"RARE Imaging: A Fast Imaging Method for Clinical MR", Hennig, et al. MRM 3:823–833 (1986).

"Extraction of Cardiac and Respiratory Motion Cycles by Use of Projection Data and Its Applications to NMR Imaging", Kim, et al., MRM 13:25–37 (1990).

"MR Image Artifacts From Periodic Motion", Wood, et al., Med. Phys. 12(2):143–147 Mar/Apr. 1985.

"Motion Artifact Reduction With Three–Point Ghost Phase Cancellation", Xiang, et al., JMRI 1(6):633–642 (1991).

"Two–Point Interference Method For Suppression of Ghost Artifacts Due to Motion", Xiang, et al., JMRI 3(6):900–906 (1993).

*Primary Examiner*—Marvin M. Lateef
*Assistant Examiner*—Eleni Mantis Mercader
*Attorney, Agent, or Firm*—Fay, Sharpe, Beall, Fagan, Minnich & McKee

[57] ABSTRACT

A subject's respiratory cycle is monitored (70) and analyzed (74) to determine a probability table (76). The probability table is continuously updated to provide a dynamic indication of the center between most stationary and most moving halves or other characteristic points within the respiratory cycle. At the beginning of each repeat time (TR), as resonance is excited (40), the output of the respiratory monitor is checked (80) and a determination is made (82) whether the patient is currently in the most stationary half or the most moving half of the respiratory cycle. Data lines generated in one half of the respiratory cycle are phase-encoded (84, 88) to generate a data line in each of a plurality of segments of k-space on one side of the central, zero phase-encoding point. Echoes occurring during the other half of the respiratory cycle are phase-encoded to generate data lines in segments of k-space on an opposite side of the central phase-encode angle. This process is repeated until a complete data set is generated with data lines generated during the stationary half of the respiratory cycle on one side of k-space and data lines generated during the half of the respiratory cycle with more motion on the other side. These data lines are then reconstructed into an image representation.

16 Claims, 2 Drawing Sheets

RESPIRATORY MOTION COMPENSATION USING SEGMENTED K-SPACE MAGNETIC RESONANCE IMAGING

BACKGROUND OF THE INVENTION

The present invention relates to the magnetic resonance imaging art. It finds particular application in conjunction with respiratory motion compensation in segmented k-space imaging sequences and will be described with particular reference thereto. However, it is to be appreciated that the invention will also find application in conjunction with other types of motion compensation and with different k-space segmentation.

In segmented k-space imaging, k-space is divided into a selected number of segments. Each resonance excitation or shot of a multiple echo imaging sequence, such as fast spin echo or echo planar imaging, is followed by a plurality of echoes commensurate with the number of segments of k-space. Each echo of the echo train generates a data line for a corresponding one of the segments of k-space. For example, the echo closest to excitation is sometimes phase-encoded to generate the data line for the segment closest to the center of k-space, the echo further from the excitation generates that data line in the segment with the largest positive or negative phase-encode angles, etc. In each repetition, a data line for each segment of k-space is generated.

One of the disadvantages of the segmented k-space approach is that one often ends up with coherent ghosts in the image. Worse, the ghosts appear at unpredicted locations, creating uncertainty whether the ghost is part of the actual image or whether it is actually an artifact.

In another technique for reducing breathing motion, two or three interleaved data sets are generated from the same region of the body in a way that the phase of the ghost component is related to the phase of the quasi-periodic motion, while the magnitude of the ghost component and both the phase and magnitude of the image component are not. Post-processing of the two or three data sets is utilized to extract the image portion of the data and cancel the ghosts.

In non-segmented k-space imaging sequences, such as a simple spin echo sequence, the order of the phase-encoding has been controlled to reduce motion artifacts. In the ROPE technique, the phase-encoding are randomly ordered. In the COPE technique, the phase-encoding is centrally ordered, i.e., the best, most motion-free data is phase-encoded to fall near the center of k-space. In the POPE technique, the phase-encoding is projection ordered. The ROPE and POPE techniques tend to make the data look monotonic; whereas, the COPE technique tends to make the data look like a centrally symmetric period.

One disadvantage is the long data acquisition times to acquire 2 or 3 interleaved data sets, typically 2–3 times as long. Moreover, a significant amount of post-processing is required to produce the final images.

Another technique for reducing motion artifacts is to interrupt data collection during periods of peak motion, i.e., respiratory gating. That is, data collection is enabled only when there is substantially no respiratory movement and prevented from occurring when there is significant respiratory movement.

Respiratory gating tends to increase the data acquisition times. Typically, data collection is blocked during a significant portion of the respiratory cycle, possibly as high as a third or a half. Blocking the data for significant fractions of the respiratory cycle increases the length of time required to acquire a full set of data significantly.

The respiratory ordered techniques ROPE, COPE, POPE, and the like, were developed for collecting only a single view after collecting information from the respiratory waveform. These techniques did not take into consideration segmentation of k-space.

The present invention provides a new and improved method for compensating for anatomical motion and reducing scan time.

SUMMARY OF THE INVENTION

In accordance with one aspect of the present invention, a method of magnetic resonance imaging is provided. Cyclic anatomical movement of a portion of a patient in an examination region is monitored. The anatomical movement cycle is analyzed such that the anatomical cycle is divided into a plurality of preselected portions in accordance with a currently monitored characteristic of the monitored motion. Magnetic resonance is excited in the examination region and a characteristic of the anatomical motion is monitored. A current anatomical cycle portion is determined from the monitored characteristic. A train of magnetic resonance echoes are induced. Each echo is phase-encoded in accordance with the determined anatomical cycle portion. Each echo is read out in the presence of a read gradient to generate a data line. The data lines are phase-encoded to fall into each of a plurality of segments of k-space which correspond to the determined current anatomical cycle. The preceding steps are cyclically repeated and the resultant data lines are reconstructed into an image representation.

In accordance with another aspect of the present invention, a magnetic resonance imaging system is provided. A magnet generates a temporally constant magnetic field through an examination region. A transmitter induces dipoles in the examination region to resonance such that radio frequency resonance signals are generated. Gradient amplifiers and gradient magnetic field coils generate at least slice select, phase, and read magnetic field gradient pulses along orthogonal axes across the examination region. A receiver receives and demodulates the radio frequency magnetic resonance signals read during the read gradients to produce a series of data lines. A reconstruction processor reconstructs the data lines into an image representation. An anatomical monitor monitors a cyclic cycle of the subject in the examination region and produces an output signal indicative thereof. A respiratory cycle measurement circuit connected to the anatomical monitor measures a characteristic of the anatomical monitor signal substantially concurrently with inducing the dipoles in the examination region to resonance. An anatomical signal analyzing circuit determines from the measured characteristic of the anatomical motion signal whether the anatomical motion is in a first portion of the cycle or in a second portion of the cycle. A phase-encoding control phase-encodes the magnetic resonance signals to be one of a positive portion of k-space or a negative portion of k-space in accordance with the determination whether the subject is in the first portion or the second portion of the cycle. In this manner, data lines on one side of k-space are collected during the first portion and data lines on the other side of k-space are collected during the second portion of the anatomical cycle.

One advantage of the present invention is that it compensates for respiratory and other anatomical motion.

Another advantage of the present invention is that it is amenable for use with multiple echo imaging techniques.

Yet another advantage of the present invention resides in the rapid acquisition of image data.

Still further advantages of the present invention will become apparent to those of ordinary skill in the art upon reading and understanding the following detailed description of the preferred embodiments.

BRIEF DESCRIPTION OF THE DRAWINGS

The invention may take form in various components and arrangements of components, and in various steps and arrangements of steps. The drawings are only for purposes of illustrating a preferred embodiment and are not to be construed as limiting the invention.

DETAILED DESCRIPTION OF THE PREFERRED EMBODIMENTS

Figure 1:
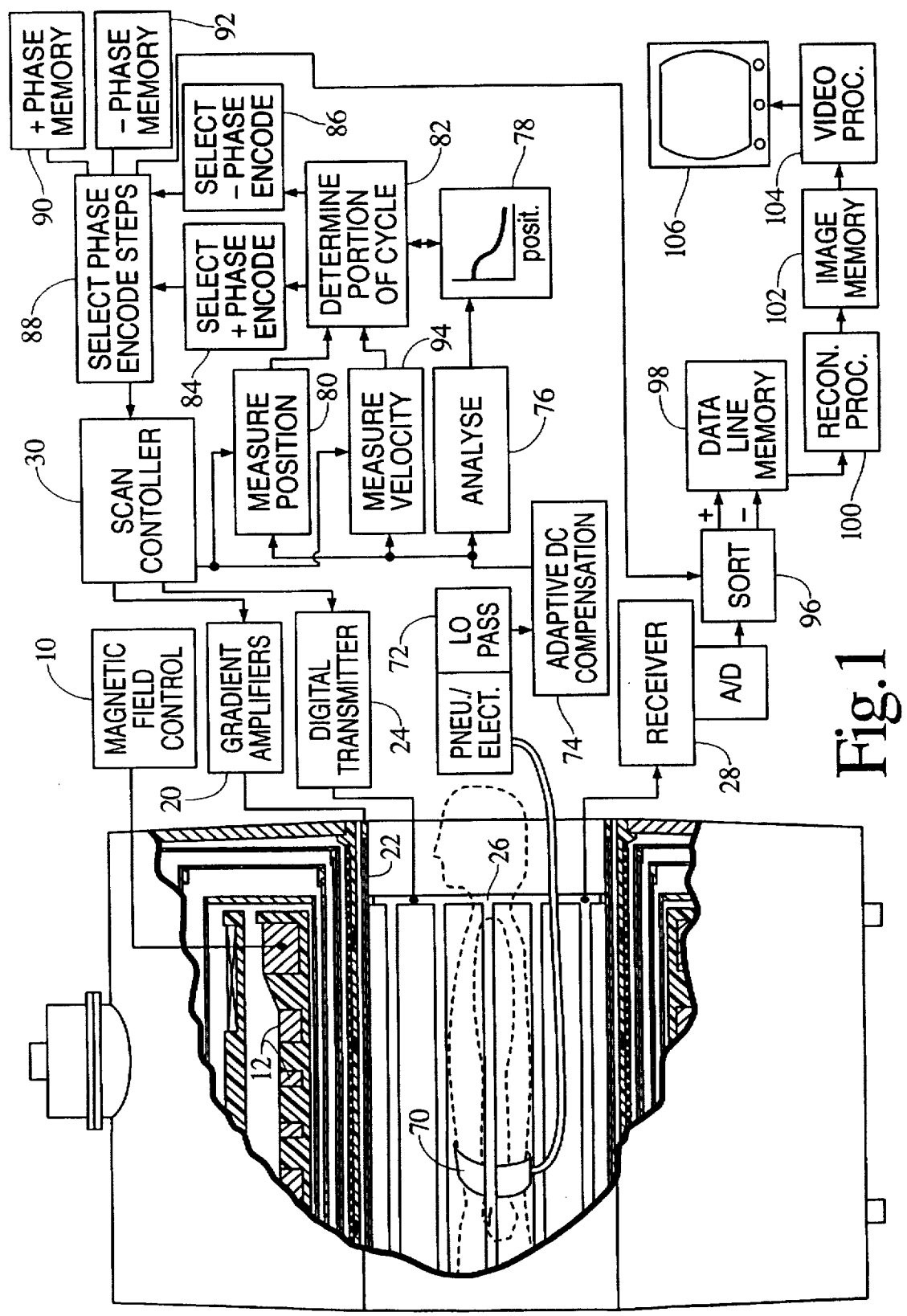
FIG. 1 is a diagrammatic illustration of a magnetic resonance imaging system in accordance with the present invention.

With reference to FIG. 1, a main magnetic field control 10 controls superconducting or resistive magnets 12 such that a substantially uniform, temporally constant magnetic field is created along a z-axis through an examination region 14. A magnetic resonance echo means applies a series of radio frequency (RF) and magnetic field gradient pulses to invert or excite magnetic spins, induce magnetic resonance, refocus magnetic resonance, manipulate magnetic resonance, spatially and otherwise encode the magnetic resonance, to saturate spins, and the like to generate magnetic resonance imaging and spectroscopy sequences. More specifically, gradient pulse amplifiers 20 apply current pulses to selected ones or pairs of whole body gradient coils 22 to create magnetic field gradients along x, y, and z-axes of the examination region 14. A digital radio frequency transmitter 24 transmits radio frequency pulses to a whole body RF coil 26 to transmit RF pulses into the examination region. Each typical radio frequency pulse is composed of a packet of immediately contiguous pulse segments of short duration which taken together with each other and any applied gradients achieve a selected magnetic resonance manipulation. The RF pulses are used to saturate, excite resonance, invert magnetization, refocus resonance, or manipulate resonance in selected portions of the examination region. For whole body applications, the resonance signals are commonly picked up by the whole body RF coil 26.

For generating images of limited regions of the subject, local coils are commonly placed contiguous to the selected location. The resultant radio frequency magnetic resonance signals are picked up by the radio frequency coil 26 or other localized coils and demodulated by a receiver 28.

A sequence control 30 applies a multiple echo imaging sequence, such as a fast spin echo sequence, in which each resonance excitation or shot is followed by a plurality or train of echoes. The echoes within each train are phase-encoded such that the data line derived from each echo of the echo train falls into one of a corresponding plurality of k-space segments as described in greater detail below.

Figure 2:
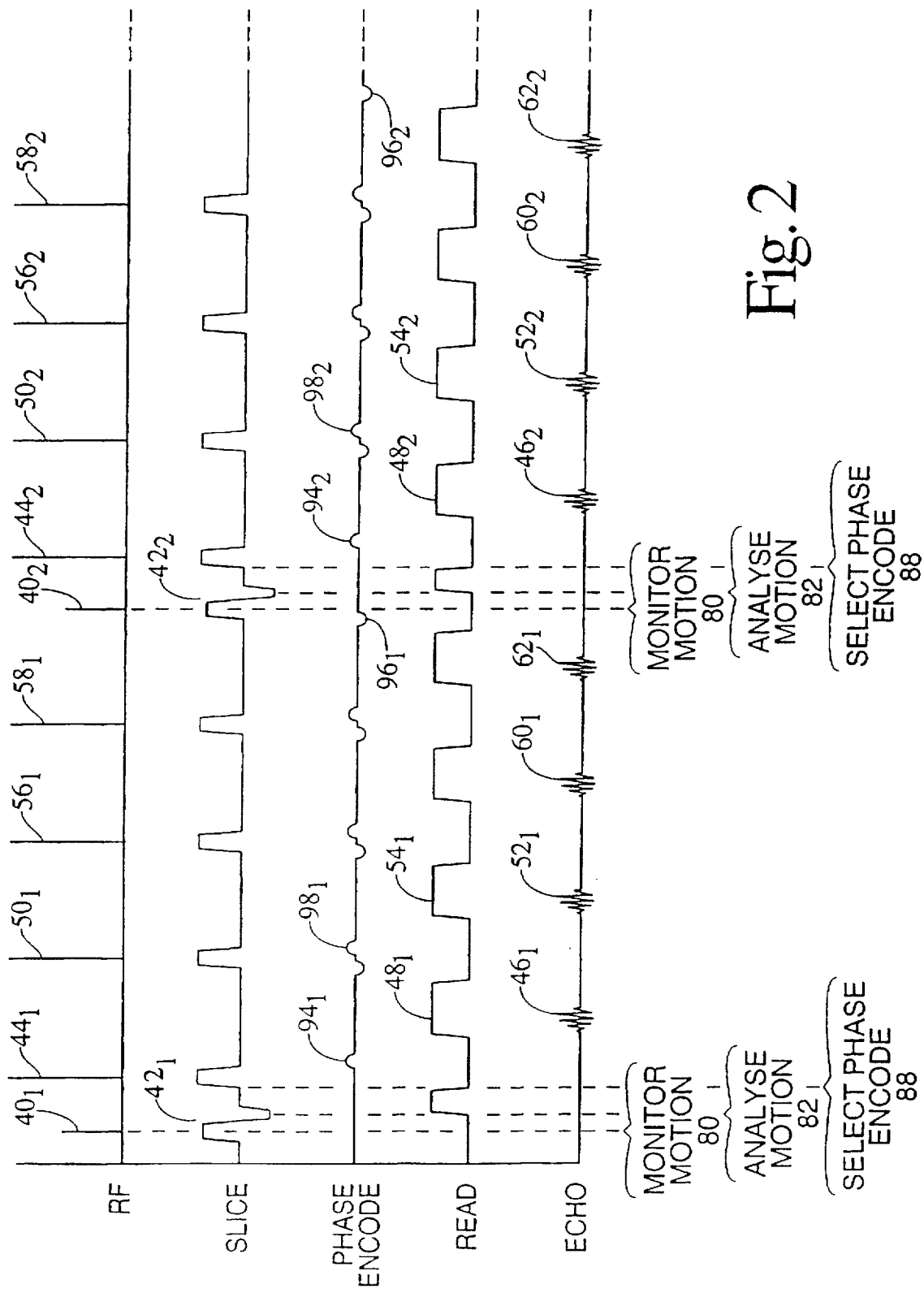
FIG. 2 is a diagrammatic illustration of a multi-slice imaging sequence in accordance with the present invention.

With reference to FIG. 2, in a fast spin echo embodiment in which the echo train has four echoes, k-space is divided into four positive k-space segments above the zero or central phase-encoded data line and four negative k-space segments below the zero or central phase-encoded data line. A radio frequency excitation pulse $40_1$, is applied in the presence of a slice select gradient $42_1$ to induce magnetic resonance. A first radio frequency refocusing pulse $44_1$ is applied to induce a first echo of the echo train $46_1$ which is read out in the presence of a first read gradient $48_1$. A second radio frequency refocusing pulse $50_1$ reinverts the magnetization to induce a second spin echo $52_1$ which is read out in the presence of a second read gradient $54_1$. Analogously, in the four echo embodiment, two additional refocusing pulses $56_1$, $58_1$ induce two additional spin echoes $60_1$, $62_1$. In other embodiments, larger or smaller numbers of echoes can be generated including as few as two spin echoes or as many as 64 or more echoes.

In a next repetition of the sequence, another RF pulse $40_2$ is applied in the presence of a second slice select gradient $42_2$ to excite resonance in another slice of the imaged volume, in the preferred multi-slice embodiment. A first refocusing pulse $44_2$ is applied to induce a first spin echo $46_2$ which is read out in the presence of a read gradient $48_2$. In a four slice embodiment, two additional repetitions are applied. In an eight slice embodiment, eight repetitions are applied before returning to the first slice and repeating the sequence. Analogously, various other numbers of slices can be imaged.

A respiratory monitor 70 monitors a patient's respiratory cycle. A low pass filter 72 or the like smooths the output signal of the respiratory monitor. An adaptive DC compensation stage 74 is used to stabilize the signal. A respiratory motion analyzer 76 analyzes the respiratory motion to develop a probability curve which is stored in a probability table 78. The analyzer 76 continues to analyze the patient's respiratory motion preceding and during a scan and continuously updates the probability table 78. The probability table can be depicted graphically as a graph of probability versus chest displacement. Conceptually, the analyzer and probability table provide a determination based on chest position whether the patient is in the more stationary half or the more moving half of the respiratory cycle. This midpoint between the high and low motion halves is dynamically adjusted during the examination for any changes in the patient's breathing cycle. Similarly, data collection during very high movement periods can be prevented and the remainder of the cycle split in half. The amount of movement which falls in the very high category is selectively adjustable. The analyzer and probability table determine, based on the degree of chest expansion, whether the patient is currently in the more moving or more stationary half of the respiratory cycle. Although the data is divided in halves in the preferred embodiment, the data may be divided in other groupings, such as quarters or the like.

Each time a repetition is to begin, e.g., one of the excitations $40_1$, $40_2$, etc. are applied, a displacement measurement circuit 80 is triggered by the scan controller 30. Based on the measured chest displacement and the probability table, an analysis circuit 82 determines whether it is more probable that the patient is currently in the more stationary half of the respiratory cycle or the half with the greater physical movement. If the patient is in the more stationary half of the respiratory cycle, a circuit 84 selects one of positive and negative phase-encoding, e.g., positive. If the chest displacement shows that the patient is in a portion of the respiratory cycle with more movement, a circuit 86 selects the other of the positive and negative phase-encoding. After the first repeat, the displacement measurement circuit is again actuated to measure chest displacement before the second slice data acquisition and the process is repeated. It should be noted that the displacement measurement is done independently for each slice.

A phase-encoding circuit 88 of the scan controller 30 accesses an appropriate one of a positive phase-encoding step memory 90 and a negative phase-encoding step memory 92. Each of the memories 90, 92 contain a series of phase-encode steps. More specifically, for each of the four echoes of the four echoes per train embodiment, there are a corresponding four phase-encoding steps, one in each segment of k-space. Because each segment of k-space might have, for example, 16 lines, there are a corresponding plurality of sets of phase-encodings. The sequence controller 30 causes a first of the phase-encodings read from the memory to be applied as a phase-encode gradient $94_1$ before the first echo. In the illustrated embodiment, a rewind gradient $96_1$, is applied after the echo to remove the phase-encoding. Before the second echo $52_1$, a second phase-encode gradient pulse $98_1$ is applied to phase-encode the second echo with the phase-encoding selected for the second segment of k-space. Additional phase-encode gradients are applied before the third and fourth echoes $60_1$, $62_1$ to select the appropriate phase-encoding for a data line in the third and fourth segments of positive or negative k-space.

This process is repeated until all of the data lines in all of the segments of all of the slices are collected. Preferably, the memories 90 and 92 also keep a record of which phase-encodings have been applied within each of the slices. Although one would statistically expect half of the readings to occur in the most stationary portion of the respiratory cycle and half in the more rapidly moving half of the respiratory cycle, there are sometimes statistical aberrations. That is, there are situations where all of the data lines in one of the positive and negative half of k-space have been collected, but there are still several data lines in the other half to collect. When this occurs, data may be discarded until measurement in the proper half of the respiratory cycle can be collected. Alternately, in order to limit the duration of the scan, the phase-encode circuit 88 takes data from the other half of the respiratory cycle in order to complete the missing data lines promptly. When this is done, the phase-encodes used are selected so as to cause the smallest variation from the desired pattern.

It is to be appreciated that an analogous process is used when the respiratory cycle is divided into four or some other number of portions. As another alternative, a respiratory motion sensor 94 is triggered at the beginning of each repetition to sense the acceleration or rate of change of physical displacement. The rate of change circuit provides an indication regarding how close the patient is to crossing between the two halves of the respiratory cycle and whether the patient is moving toward the other half. If a significant number of echoes will occur after the patient has crossed into the other half of the respiratory cycle, the analysis circuit 82 classifies the data in the half of the respiratory cycle in which the majority of echoes occur. As yet another alternative, the analysis circuit 82 classifies a fraction of the echoes in one half of the respiratory cycle and the rest of the echoes in the other half of the respiratory cycle.

The phase-encode selection circuit 88 further controls a sorting circuit 96 which sorts the data lines into appropriate positions within a data line memory 98. An image reconstruction processor 100 reconstructs the data set into an image representation that is stored in an image memory 102. A video processor 104 converts selected slices, three-dimensional renderings, and other portions of the data in the image memory into appropriate format for display on a human-readable monitor 106.

The combination of k-space segmentation with the selection of phase-encode steps based on position in the respiratory cycle allows for a significant reduction in scan time over respiratory gating and other respiratory ordered techniques such as ROPE, COPE, and POPE. Independently selecting phase-encode steps on a slice by slice basis minimizes the necessity of rejecting data and assists in reducing scan time.

The invention has been described with reference to the preferred embodiment. Obviously, modifications and alterations will occur to others upon reading and understanding the preceding detailed description. It is intended that the invention be construed as including all such modifications and alterations insofar as they come within the scope of the appended claims or the equivalents thereof.

Having thus described the preferred embodiment, the invention is now claimed to be:

1. A magnetic resonance imaging system which includes a magnet for generating a temporally constant magnetic field through an examination region, a transmitter for inducing resonance of dipoles in the examination region such that radio frequency magnetic resonance signals are generated, gradient amplifiers and gradient magnetic field coils for generating magnetic field gradient pulses along orthogonal axes across the examination region for at least phase-encoding the induced resonance and frequency encoding the induced resonance, a receiver for receiving and demodulating the radio frequency magnetic resonance signals read during the frequency encoding gradients to produce a series of data lines, and a reconstruction processor reconstructs the data lines into an image representation, the system further comprising:

an anatomical monitor for continuously monitoring an anatomical cycle of a subject in the examination region and producing an output signal indicative thereof;

a cycle measurement circuit connected to receive the output signal from the anatomical monitor for measuring a characteristic of the anatomical cycle in accordance with the output signal substantially concurrently with induction to resonance of the dipoles in the examination region;

an anatomical signal analyzing circuit for determining from the measured characteristic of the anatomical cycle whether the anatomical cycle is in a first portion or a second portion thereof;

a phase-encoding control for selectively phase-encoding the induced resonance such that the magnetic resonance signals are in one of a positive or a negative portion of k-space in response to the determination of whether the subject is experiencing the first portion or the second portion of the anatomical cycle, such that data lines in one of the positive and negative portions of k-space are collected during the first portion of the anatomical cycle and data lines in the other portion of k-space are collected during the second portion of the anatomical cycle.

2. The magnetic resonance imaging system as set forth in claim 1 wherein the anatomical signal analyzing circuit continuously analyzes and updates the analysis of the measured characteristic of the anatomical cycle during magnetic resonance imaging scans.

3. The magnetic resonance imaging system as set forth in claim 1 wherein the measured characteristic of the anatomical cycle includes one of physical displacement and acceleration due to respiratory movement.

4. The magnetic resonance imaging system as set forth in claim 1 wherein the first portion of the anatomical cycle is a half of the anatomical cycle with the most anatomical movement and the second portion of the anatomical cycle is a half of the anatomical cycle with the least anatomical movement.

5. The magnetic resonance imaging system as set forth in claim 1 further including at least one memory for keeping track of which phase-encode angles in each of the positive and negative portions of k-space have been collected in each of a plurality of slices.

6. A magnetic resonance imaging system which includes a magnet which generates a temporally constant magnetic field through an examination region, a transmitter which induces resonance of dipoles in the examination region such that radio frequency magnetic resonance signals are generated, gradient amplifiers and gradient magnetic field coils which generate magnetic field gradient pulses across the examination region for at least phase-encoding and frequency encoding the induced resonance, a receiver which receives and demodulates the radio frequency magnetic resonance signals to produce a series of data lines and a reconstruction processor which reconstructs the data lines into an image representation, the system further comprising:

an anatomical monitor for continuously monitoring an anatomical cycle of a subject in the examination region in real time and on-the-fly producing an output signal indicative thereof a cycle measurement circuit connected to receive the output signal from the anatomical monitor for measuring a characteristic of the anatomical cycle in accordance with the output signal;

an anatomical signal analyzing circuit for determining from the measured characteristic of the anatomical cycle whether the anatomical cycle is in a first portion or a second portion thereof, the anatomical signal analyzing circuit having:

a memory for storing a probability table which indicates a probability of the anatomical cycle being in the first or second portion thereof versus the measured characteristic of the anatomical cycle; and, a circuit for analyzing the anatomical monitor output signals to update and revise the probability table; and, a phase-encoding control for selectively phase-encoding the magnetic resonance signals in response to the determination of whether the subject is experiencing the first portion or the second portion of the anatomical cycle, such that data lines in one portion of k-space are collected during the first portion of the anatomical cycle and data lines in another portion of k-space are collected during the second portion of the anatomical cycle.

7. A method of magnetic resonance imaging comprising:

(a) monitoring a cyclic anatomical movement of a portion of a patient in an examination region;

(b) analyzing the anatomical movement cycle such that the anatomical cycle is divided into a plurality of preselected portions in accordance with a currently monitored characteristic of the monitored motion;

(c) exciting magnetic resonance in the examination region of the subject;

(d) contemporaneously with the exciting step (c), monitoring the characteristic of the anatomical motion;

(e) determining a current anatomical cycle portion from the monitored characteristic;

(f) inducing a train of magnetic resonance echoes;

(g) phase-encoding each echo in accordance with the determined anatomical cycle portion;

(h) reading out each echo in the presence of a read gradient to generate a data line, the data lines being phase-encoded to fall into each of a plurality of segments of k-space which correspond to the determined current anatomical cycle portion;

(i) cyclically repeating at least steps (c)–(h);

(j) reconstructing the data lines into an image representation.

8. The method as set forth in claim 7 wherein:

(k) steps (c)–(h) are performed for a first slice;

(l) indexing to a second slice and repeating steps (c)–(h);

(m) cyclically repeating steps (k) and (l).

9. The method as set forth in claim 8 further including after step (l), repeating at least steps (c)–(h) in each of a plurality of additional slices.

10. The method as set forth in claim 7 wherein the monitored characteristic at excitation is utilized to select the phase-encoding of all echoes in a train of echoes following the excitation.

11. The method as set forth in claim 7 wherein the a anatomical cycle is a respiratory cycle.

12. A method of magnetic resonance imaging comprising:

(a) monitoring a cyclic respiratory movement of a portion of a patient in an examination region;

(b) analyzing the respiratory movement cycle such that the respiratory cycle is divided into two halves in accordance with a currently monitored characteristic of the monitored motion;

(c) exciting magnetic resonance in the examination region of the subject;

(d) monitoring the characteristic of the respiratory motion;

(e) determining a current respiratory cycle half from the monitored characteristic;

(f) inducing a train of magnetic resonance echoes;

(g) phase-encoding each echo in accordance with the determined respiratory cycle half;

(h) reading out each echo in the presence of a read gradient to generate a data line, the data lines being phase-encoded to fall into each of a plurality of segments of k-space which correspond to the determined current respiratory cycle half;

(i) cyclically repeating at least steps (c)–(h);

(j) reconstructing the data lines into an image representation.

13. The method as set forth in claim 12 wherein the steps (d) and (b) continue during steps (c)–(h) and the division of the respiratory cycle between the two halves is dynamically updated.

14. A method of magnetic resonance imaging comprising:

(a) monitoring a cyclic respiratory movement of a portion of a patient in an examination region;

(b) analyzing the respiratory movement cycle such that the respiratory motion is divided into a first most stationary portion and a second portion with greatest respiratory movement;

(c) exciting magnetic resonance in the examination region of the subject;

(d) monitoring a characteristic of the respiratory motion;

(e) determining a current respiratory cycle portion from the monitored characteristic;

(f) inducing a train of magnetic resonance echoes;

(g) phase-encoding each echo in accordance with the determined respiratory cycle portion;

(h) reading out each echo in the presence of a read gradient to generate a data line, the data lines generated during the first portion of the respiratory motion are phase-encoded in segments of k-space on a first side of a central phase-encoding and data lines in the second portion of the respiratory motion are phase-encoded in segments of k-space on an opposite side of the central phase-encoding;

(i) cyclically repeating at least steps (c)–(h);

(j) reconstructing the data lines into an image representation.

15. A method of magnetic resonance imaging comprising:

(a) continuously monitoring a cyclic anatomical movement of a portion of a patient in an examination region;

(b) analyzing the anatomical movement cycle such that the anatomical cycle is divided into a plurality of preselected portions in accordance with a currently monitored characteristic of the monitored motion by employing a probability table which associates a probability of the anatomical cycle being in a preselected portion of the anatomical cycle with the monitored anatomical movement;

(c) exciting magnetic resonance in the examination region of the subject;

(d) monitoring the characteristic of the anatomical motion;

(e) determining a current anatomical cycle portion from the monitored characteristic;

(f) inducing a train of magnetic resonance echoes;

(g) selectively phase-encoding each echo in response to the determined anatomical cycle portion;

(h) reading out each echo in the presence of a read gradient to generate a data line, the data lines being phase-encoded to fall into each of a plurality of segments of k-space which correspond to the determined current anatomical cycle portion;

(i) cyclically repeating at least steps (c)–(h);

(j) reconstructing the data lines into an image representation.

16. A method of magnetic resonance imaging comprising:

(a) monitoring a cyclic anatomical movement of a portion of a patient in an examination region;

(b) analyzing the anatomical movement cycle such that the anatomical cycle is divided into a plurality of preselected portions in accordance with a currently monitored characteristic of the monitored motion;

(c) exciting magnetic resonance in the examination region of the subject;

(d) inducing a train of magnetic resonance echoes;

(e) monitoring the anatomical condition characteristic between echoes;

(f) determining a current anatomical cycle portion currently with each echo form the monitored characteristic;

(g) phase-encoding each echo in accordance with the monitored characteristics;

(h) reading out each echo in the presence of a read gradient to generate a data line, the data lines being phase-encoded to fall into each of a plurality of segments of k-space which correspond to the determined current anatomical cycle portion;

(i) cyclically repeating at least steps (c)–(h);

(j) reconstructing the data lines into an image representation.

* * * * *